United States Patent
Locher

(10) Patent No.: US 6,480,070 B2
(45) Date of Patent: Nov. 12, 2002

(54) LOW POWER, NO DEADZONE PHASE FREQUENCY DETECTOR WITH CHARGE PUMP

(75) Inventor: Matthias Locher, San Jose, CA (US)

(73) Assignee: Koninklijke Phillips Electronics N.V., Eindhoven (NL)

(*) Notice: Subject to any disclaimer, the term of this patent is extended or adjusted under 35 U.S.C. 154(b) by 0 days.

(21) Appl. No.: 09/804,017

(22) Filed: Mar. 12, 2001

(65) Prior Publication Data
US 2001/0022538 A1 Sep. 20, 2001

(30) Foreign Application Priority Data
Mar. 15, 2000 (EP) .............................. 00200945

(51) Int. Cl.[7] .............................................. H03L 7/089
(52) U.S. Cl. ........................... 331/17; 331/1 A; 331/25; 327/157; 327/159
(58) Field of Search ..................... 331/1 A, 8, 14, 331/17, 18, 25; 327/156–159; 360/51; 375/376; 455/260

(56) References Cited

U.S. PATENT DOCUMENTS 5,359,299 A * 10/1994 Webster ...................... 331/8

OTHER PUBLICATIONS

"A PLL Clock Generator with 5 to 110 MHz of Lock Range for Microprocessors", by I.A. Young et al., IEEE Journal of Solid–State Circuits, vol. 27, No. 11, Nov. 1992.

"A Variable Delay Line PLL for CPU–Coprocessor Synchronization", by M. G. Johnson et al., IEEE Journal of Solid–State Circuits, vol. 23, No. 5, Oct. 1988.

"A Wide–Band Tuning System for Fully Integrated Satellite Receivers", by C. Vaucher et al., IEEE Journal of SolidState Circuits, vol. 33, No. 7, Jul. 1998.

* cited by examiner

*Primary Examiner*—David Mis
(74) *Attorney, Agent, or Firm*—Aaron Waxler

(57) ABSTRACT

In a frequency synthesizer with a phase locked loop a charge pump (2) is present with an idle path (5-C, 6-C, 7, 8). The idle path (5-C, 6-C, 7, 8) is activated only shortly before an up or down pulse appears at an output (15, 16) of a phase frequency detector (1) and the idle path (5-C, 6-C, 7, 8) is disabled shortly after the disappearance of an up or down signal. Means (20) to generate a signal for controlling the enablement and disablement of the idle path (5-C, 6-C, 7, 8) may comprise a down-counter divider (30) or a zipper divider (35).

5 Claims, 3 Drawing Sheets

| 13 / 14 | 17 / 18 | a | b | c |
|---------|---------|---|---|---|
| 0 | 0 | * | | |
| 0 | 1 | | | * |
| 1 | 1 | | * | |
| 0 | 1 | | | * |
| 0 | 0 | * | | |

LOW POWER, NO DEADZONE PHASE FREQUENCY DETECTOR WITH CHARGE PUMP

BACKGROUND OF THE INVENTION

The invention relates to a phase locked loop circuit for locking a clock signal to an input signal comprising a phase frequency detector for supplying up pulse signals and down pulse signals to a charge pump, which charge pump comprises a set of current sources and an idle path for maintaining current supplying transistors in the current sources in a current conductive state when no up an down signals are present.

A phase frequency detector and a charge pump are critical parts in synthesizers. When the synthesizer is locked the phase frequency detector delivers short up and down pulse signals to the charge pump. In the short period of time that an up pulse signal or down pulse signal lasts, of the order of one nanosecond, the charge pump should deliver equal up and down current pulses, respectively to its output. Standard charge pumps are limited by the time constant of switching on output current mirror transistors when changing state from off (no current) to saturation (current on). Because N- and PMOS react with different time constants additional delays must be included in the phase detector's feedback to compensate for such different time constants. The additional delays allow up or down currents to settle.

A drawback of a delay is increased noise in the synthesizer loop because of increased time of noise injection of the more or less conducting mirror transistors.

I. Young, "A PLL Clock Generator with 5 to 110MHz of Lock Range for Microprocessors", JSSC, 11.1992, pp 1599 and M. Johnson, "A variable delay line PLL for CPU–coprocessor synchronization", JSSC, 10.1998, pp 1218–1223 describe using a dummy path to prevent the mirror transistors leaving the saturation region. The cut in the mirror transistors is kept stable by switching the current over a dummy path while neither up nor down path is active. This known solution greatly reduces or avoids the delay needed in the phase frequency detector.

However, a drawback of this known solution is increased power because the tail current is always flowing.

SUMMARY OF THE INVENTION

It is an object of the present invention to lower the amount of power needed to control a charge pump wit an idle path.

A phase locked loop circuit according to the invention thereto is characterized in that first means are present for enabling and disabling the idle path in response to idle path enabling and idle path disabling signals, respectively and in that second means are present for, shortly before an appearance of up and down pulse signals, respectively generating an idle path enabling signal and for, shortly after the respective up and down pulse signals have disappeared, generating an idle path disabling signal.

Because the up and down pulse signals themselves last only for a very short time relative to a substantially larger period of time between subsequent up and down pulse signals a great power saving is achieved.

BRIEF DESCRIPTION OF THE DRAWING

The invention will now be described in more detail referring to various embodiments shown in the accompanying drawings in which:

FIG. 5 shows a truth table.

DETAILED DESCRIPTION OF THE PRIMARY EMBODIMENT

Figure 1:
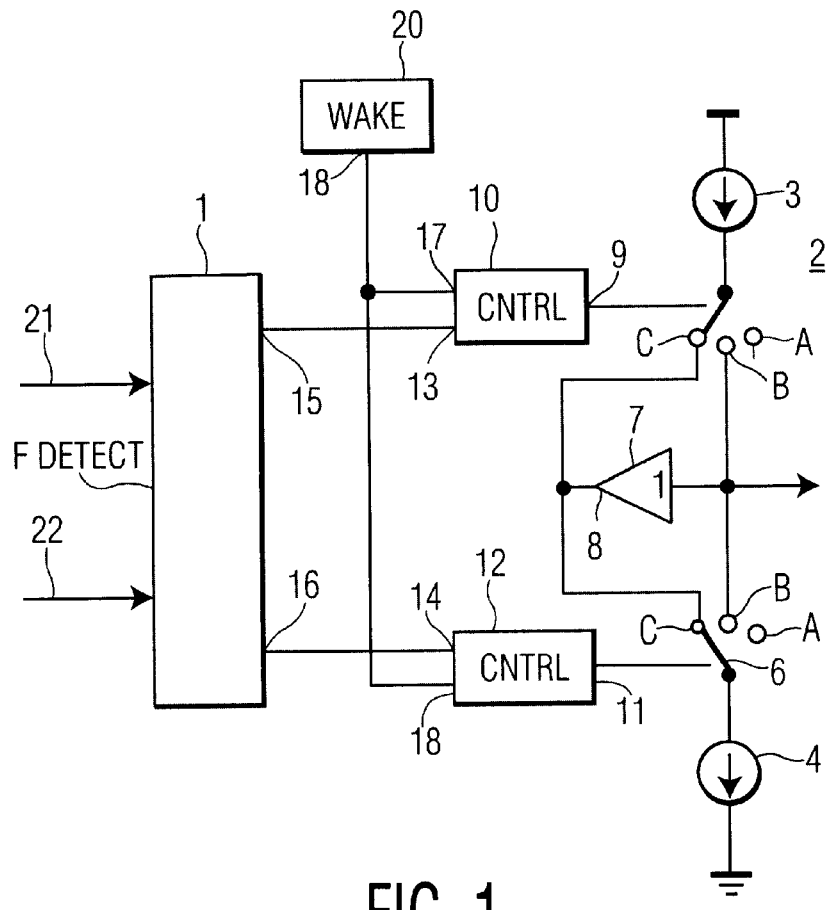
FIG. 1 shows a phase frequency detector and a charge pump according to the invention.

Referring to FIG. 1 there are shown a phase frequency detector 1 and a charge pump, generally designated by the reference numeral 2. The charge pump 2 comprises a first current source 3 and a second current source 4. Current source 3 is connected to a first three position switch 5 and current source 4 is connected to a second three position switch 6. First positions of the tee position switches 5 and 6 are indicated by the letter A, second positions are indicated by the letter B and third positions are indicated by the letter C. The contacts at positions C are connected to an output 8 of a one time amplifier 7. An input of the one time amplifier 7 is connected to the connections B. The connections B are also connected to a connection of the charge pump 2 to a subsequent loop filter (not shown). Three position switch 5 is controlled by an output 9 of a control circuit 10. Three position switch 6 is connected to an output 11 of a control circuit 12. First inputs 13 and 14, respectively of control circuits 10 and 12, respectively are connected to an up signal output 15 and a down signal output 16, respectively of the phase frequency detector 1. Second inputs 17 and 18, respectively of the control circuits 10 and 12, respectively are both connected to an output 19 of a wakeup signal circuit 20. The wake-up signal circuit 20 will be described in more detail with reference to FIGS. 2 and 3. The phase frequency detector Her is connected to a voltage-controlled oscillator (not shown) through line 21 and to a reference circuit through line 22 either directly or through an additional reference frequency divider circuit (not shown).

Figure 5:
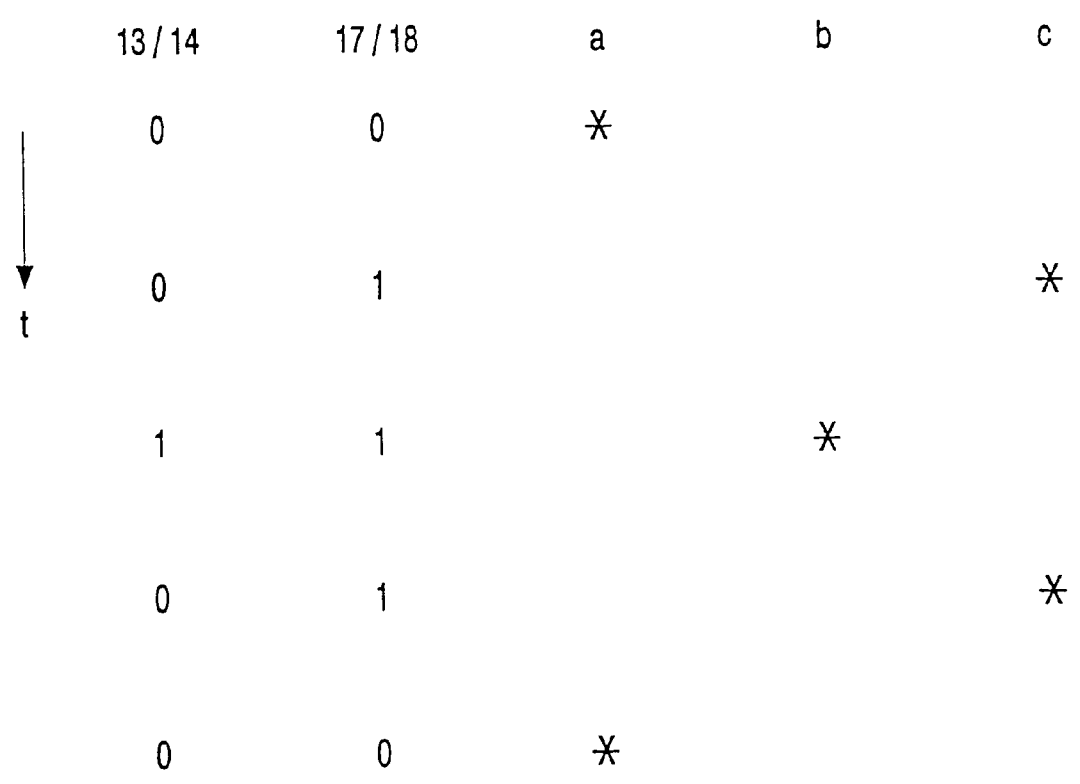

It is to be noted that the duration of the up and down pulses is very short, on the order of 1 ns, whereas the period of time between subsequent up and down pulses is much larger. Circuit 20 generates a signal at its output 19 and thus at the inputs 17 and 18 of the control circuits 10 and 12. The output signal of the circuit 20, which hereinafter will be called the wakeup signal, starts shortly before an appearance of an up or a down pulse signal, and disappears again shortly after the up or down pulse signal, just mentioned, has disappeared. A truth table of the output 9 as it determines whether the tree position switch 5 will be in its A, its B, or its C position is shown in FIG. 5. FIG. 5 has been set up in such a way that it also shows in subsequent lines subsequent positions of the three position switches 5 and 6 as a fiction of time.

When neither an up pulse signal is present at output 15 nor a down pulse signal is present at output 16 of the phase frequency detector 1 and when also no signal is present at the output 19 of wake-up signal circuit 20 the three position switches 5 and 6 arc in their A positions. Subsequently just before an up pulse signal appears at output 15 or a down pulse signal appears at output 16 of phase frequency detector 1 a signal appears at the output 19 of the wake-up signal circuit 20. The signal appears at the inputs 17 and 12 of the control circuits 10 and 12. As a consequence of the appearance of a signal at the inputs 17 and 18 at the same time that no up pulse signal is present at output 15 and input 13 and also no down pulse signal is present at output 16 and input 14 control circuits 10 and 12 control three position switches 5 and 6 to take up the positions C. In the C positions the current sources 3 and 4 are connected to the output 8 of the one time amplifier 7 and start generating and drawing, respectively current, i.e. the current sources 3 and 4 are woken up. In practice subsequently both an up pulse signal and a down pulse signal appear for a very short time. In lock state both up and down pulse signals have equal lengths. In unlock state, however, one of both has a longer duration than the other one. This is shown in the third line of the table of FIG. 5. Control circuits 10 and 12 are configured in such a way that upon the receipt of a signal at both inputs, i.e. inputs 13 and 17 of control circuit 10 and inputs 14 and 18 of control circuit 12, a signal will be generated at outputs 9 and 11, repeatively to control three position switch 5 and three position switch 6, respectively to take up the B position. Since either output 15 or output 16 carries a signal a little longer than output 16 and output 15, respectively one of the two three position switches 5 and 6 will be switched to its B position a little longer than the other one. After the disappearance of both the up pulse signal at output 15 and the down pulse signal at output 16 both control circuits 10 and 12 do not have a signal at their inputs 13 and 14, respectively and still have a signal at their inputs 17 and 18, respectively. Output signals at outputs 9 and 11, respectively control three position switches 5 and 6, respectively in such a way that again the C positions are taken. Next, since it will take a "long" time before the next up pulse signal or down pulse signal appears at outputs 15 and 16, respectively wake-up signal circuit 20 puts tee control circuits 10 and 12 back to rest again by letting the wake-up signal disappear at its output 19, and therefore at the inputs 17 and 18 of the control circuits 10 and 12. Since the control circuits 10 and 12 now have no signal at any input anymore outputs 9 and 11 carry signal to move the three position switches 5 and 6 to their A positions.

Figure 2:
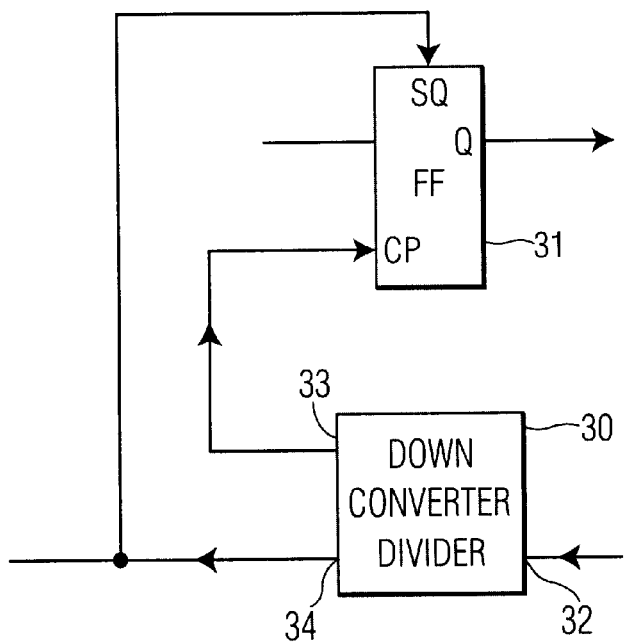
FIG. 2 shows the second means according to the invention.

FIG. 2 shows a first embodiment of a wake-up circuit 20. The wake-up signal circuit shown in FIG. 2 comprises a down-counter divider 30 and a flip-flop 31, The down-counter divider 30 is connected between an output of a synthesizer and a reference input of the phase frequency detector 1. An input 32 of down-counter divider 30 is connected to a source of high frequency signals, for example an output of a voltage controlled oscillator (not shown). Down-counter divider 30 is configured in such a way that at an output 33 a signal appears upon reaching account of one and that at an output 34 a signal appears upon reaching a count of zero. The counts one and zero are given by way of example only. At output 33 this signal may also appear at other low counts, like two and three etceteras. At output 34 a signal may also appear at a, high, starting counting number or a number reached shortly thereafter. It is of importance tat first a signal appears at output 33 and thereafter a signal appears at output 34. Output 33 is connected to a clock pulse input of flip-flop 31. Output 34 is connected to an input SO (Set Output) of flip-flop 31. Output Q of flip-flop 31 is the equivalent of output 19, shown in FIG. 1. The appearance of a signal at output 33 takes place just before an up or down pulse signal appears at outputs 15 and 16, respectively of phase frequency detector 1. The signal at output 33 of down-counter divider 30 generates the stan of a signal at output Q of flip-flop 31. Subsequently, on reaching count zero the phase frequency detector which is connected to output 34 of down-counter divider 30 is triggered to generate either an up pulse signal at output 15 or a down pulse signal at output 16. After the disappearance of the signal at output 34 flip-flop 31 makes output Q low again. From the above description it will be clear that down-counter divider 30 and flip-flop 31 and their interconnection together operate to make appear at output Q a signal that is identical to the signal at output 19 of control circuit 20. Therefore down-counter divider 30 and flip-flop 31 connected together in the way as shown in FIG. 2 form a wake-up signal circuit 20 as defined in FIG. 1 with the Q output of flip-flop 31 forming output 19 of wake-up signal circuit 20.

Figure 3:
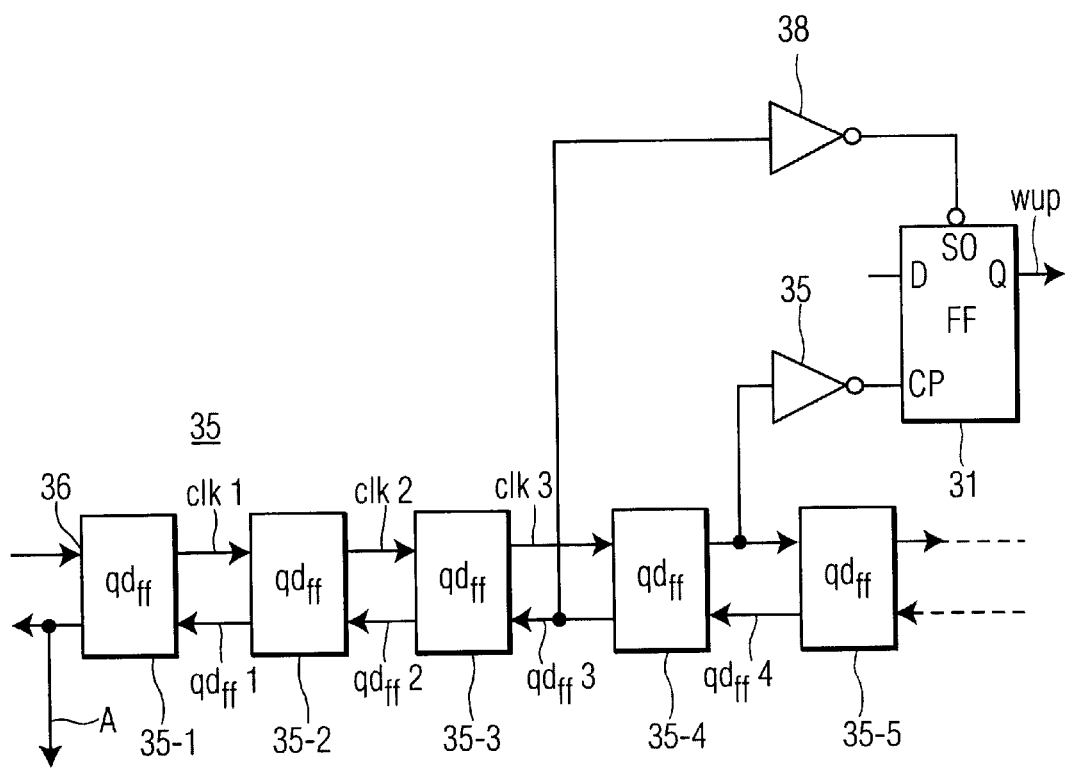
FIG. 3 shows a second embodiment of the second means according to the invention.

FIG. 3 shows an other embodiment of a wake-up signal circuit 20. In this case again the flip-flop 31 is present with an output Q, an input SO and an input CP. Furthermore a zipper divider 35 is present, comprising individual cells 35/1, 35/2, 35/3, 35/4 and 35/5 . . . etcetera. Zipper dividers are described in "Wide-band Tuning System for Fully Integrated Satellite Receivers", Cicero Vaucher and Dieter Kasperkovitz, IEEE, JSSC July 1998. A clock input 36 of individual divider 35/1 receives a clock signal from a crystal oscillator (not shown) or the VCO (not shown). A clock output of individual divider 35/1 is connected to a clock input of individual divider 35/2 and a clock signal clk 1 is present between individual dividers 35/1 and 35/2. In the same way clock signals clk 2, clk 3, clk 4, ... etc. are present. From the right-hand side (not shown) of the zipper divider 35 qdff-signals move fit right to left, as shown in FIG. 3. Input CP of flip-flop 31 is connected to signal clk 4 to an invertor 37, and input SO of flip-flop 31 is connected to signal qdff 3 through an invertor 38. Input Q of flip-flop 31 is always set to logic 1.

Figure 4:
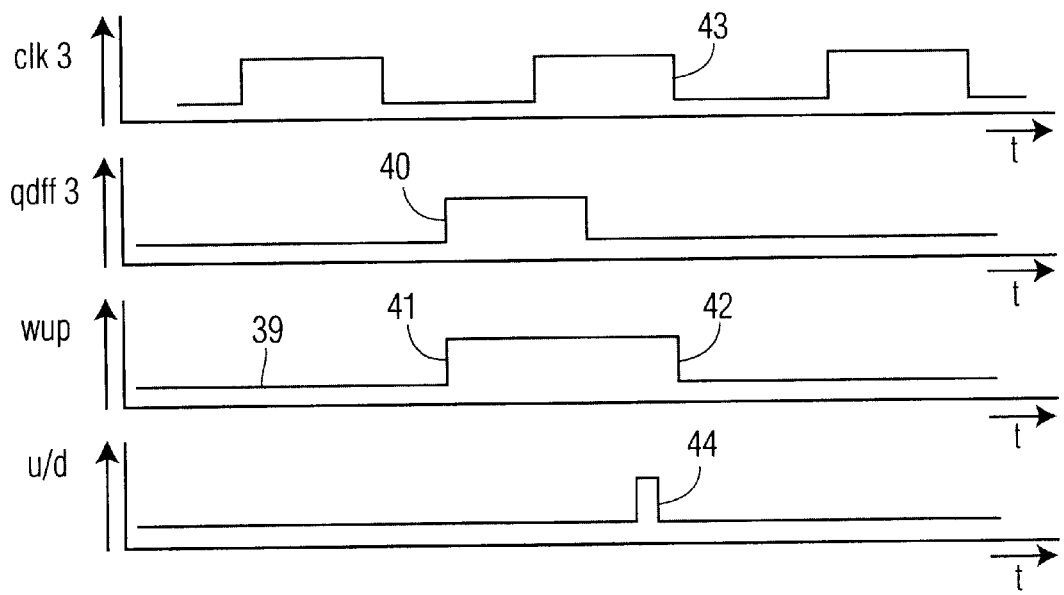
FIG. 4 shows various timing signals.

The operation of the circuit shown in FIG. 3 is as follows. The output Q of flip-flop 31 in general is low as shown by signal 39 in FIG. 4. Upon signal qdff 3 going high, as shown in FIG. 4 at 40, output Q of flip-flop 31 at which the WUP (wake-up) signal appears, also goes high as shown at 41 in FIG. 4. Also as shown in FIG. 4 after the WUP signal at output Q of flip-flop 31 has gone high it goes low again after a clock signal, such as clk 4 has gone low, as shown at 42 and 43, respectively in FIG. 4. So the wakeup signal WUP at output Q of flip-flop 31 starts at the leading edge of a qdff signal and stops at a trailing edge of a clock signal. FIG. 4 also shows the appearance and, very shortly thereafter, disappearance of an up or down pulse signal U/D. In the configuration shown the signal qdff 3 is the last qdff signal, before the qdff signals qdff 2 and qdff 1 and the qdff output signal of individual divider 35/1, with a leading edge appearing before the up or down signal 44. Also clock signal clk 4 is the first clock signal with a training edge hat appears after the appearance and disappearance of the up or down pulse signal 44. The wake-up signal WUP therefore is the shortest signal available with a leading edge before the up or down pulse signal 44 and with a trailing edge after the up or down pulse signal 44. Nevertheless it is also possible to make use of other qdff signals, for example qdff 4 or qdff 5 etc. and of other clock signals clk, for example clk 5, clk 6, etc.

It will be clear that also the zipper divider 35, connected together with the flip-flop 31 and inverters 37 and 38 as shown in FIG. 3 fulfill the requirements of a wake-up signal circuit 20 as defined in relation to FIG. 1.

Because die pulses at the outputs qdff of the individual dividers 35/n (n equals 1, 2, 3, etc.) travel from right to left in FIG. 3 and are reclocked at every individual divider only noise of the leading stages is in the signal. This forces the signal to be taken out as far as possible in the beginning of the loop and gives much freedom in the selection of the wake,up signal. The qdff output of individual divider 35/1 is connected to the phase frequency detector, as shown by arrow A and functions as the clock for the phase frequency detector. The qdff path contains a pulse with Fe periodicity set by the divide ratio. The length of the pulse is half a clock period of the clock output of the preceding individual divider. A pulse travels from the end of the loop (at the right hand side, not shown) to the beginning of the divider, the left-hand side of individual divider 35/1. The pulse is delayed at each cell by two output clocks. This signal qdff indicates a coming clock pulse and therefore is used to enable the idle current though the idle path of the charge pump.

After the foregoing description various modifications of the circuits shown will become apparent to a person skilled in the art. Such modifications are intended to be comprised in the scope of protection of the appended claims.

What is claimed is:

1. Phase locked loop circuit for locking a clock signal to an input signal comprising a phase frequency detector (1) for supplying up pulse signals and down pulse signals to a charge pump (2), which charge pump comprises a set of current sources (3,4) and an idle path (5-C, 6-C, 7, 8) for maintaining current supplying transistors in the current sources (3, 4) in a current conductive state when no up and down pulse signals are present characterized in that first means (10, 12) are present for enabling and disabling the idle path (5-C, 6-C, 7, 8) in response to idle path enabling (41) and idle path disabling (42) signals, respectively and in that second means (20) are present for, shortly before an appearance of up and down pulse signals, respectively generating an idle path enabling signal (41) and for, shortly after the respective up and down signals have disappeared, generating an idle path disabling signal (42).

2. Circuit according to claim 1 characterized in that a down-counter divider (30) is provided for generating the idle path enabling signal at a low count and for generating the idle path disabling signal at a high count after having restarted counting.

3. Circuit according to claim 2 characterized in that the low count is one.

4. Circuit according to claim 1 characterized in that the second means comprise a zipper divider (35) and a flip-flop (31).

5. Circuit according to claim 4 characterized in that a signal (qdff) from a returning path of the zipper divider (35) is connected to a first input (SO) of the flip-flop (31) and in that a signal (clk) of a clock output of the zipper divider (35) is connected to a second input (CP) of the flip-flop (31).

\* \* \* \* \*

UNITED STATES PATENT AND TRADEMARK OFFICE
CERTIFICATE OF CORRECTION

PATENT NO.   : 6,480,070 B2
DATED        : November 12, 2002
INVENTOR(S)  : Matthias Locher It is certified that error appears in the above-identified patent and that said Letters Patent is hereby corrected as shown below:

<u>Title page,</u>
Item [73], Assignee, change "Phillips" to -- Philips --.

Signed and Sealed this

Twenty-fifth Day of March, 2003

JAMES E. ROGAN
*Director of the United States Patent and Trademark Office*